United States Patent
Burton (10) Patent No.: US 6,258,218 B1
(45) Date of Patent: Jul. 10, 2001

(54) METHOD AND APPARATUS FOR VACUUM COATING PLASTIC PARTS

(75) Inventor: Clive H. Burton, Novato, CA (US)

(73) Assignee: Sola International Holdings, Ltd., Lonsdale (AU)

(*) Notice: Subject to any disclaimer, the term of this patent is extended or adjusted under 35 U.S.C. 154(b) by 0 days.

(21) Appl. No.: 09/422,948

(22) Filed: Oct. 22, 1999

(51) Int. Cl.$^7$ .................................................. C23C 14/34
(52) U.S. Cl. .................... 204/192.12; 204/192.12; 204/298.09; 204/298.15; 204/298.28
(58) Field of Search ................ 204/192.12, 192.14, 204/192.26, 298.07, 298.09, 298.11, 298.28, 298.25, 298.15; 118/724, 725, 729, 730, 732; 62/55.5

(56) References Cited

U.S. PATENT DOCUMENTS

| | | |
|---|---|---|
| 2,758,510 | 8/1956 | Auwärter . |
| 3,168,819 | 2/1965 | Santeler . |
| 4,010,312 | 3/1977 | Pinch et al. . |
| 4,051,010 * | 9/1977 | Roth et al. ........................ 204/298.26 |
| 4,071,426 | 1/1978 | Pinch et al. . |
| 4,172,156 | 10/1979 | Ritter et al. . |
| 4,361,418 | 11/1982 | Tscheppe . |
| 4,420,385 | 12/1983 | Hartsough . |
| 4,535,597 | 8/1985 | Missimer et al. . |
| 4,591,418 | 5/1986 | Snyder . |
| 4,597,267 | 7/1986 | Forrest . |
| 4,647,361 | 3/1987 | Bauer ................................ 204/298.09 |
| 4,798,994 | 1/1989 | Rijpers et al. ........................ 313/478 |
| 4,851,095 | 7/1989 | Scobey et al. ................... 204/192.12 |
| 5,009,073 | 4/1991 | Missimer et al. ..................... 62/51.1 |
| 5,057,878 | 10/1991 | Geddes et al. .......................... 257/30 |
| 5,121,707 | 6/1992 | Kanoo ................................... 118/725 |
| 5,152,805 | 10/1992 | Geddes et al. ....................... 29/25.02 |
| 5,356,485 | 10/1994 | Kreider .................................. 136/225 |
| 5,502,139 | 3/1996 | Toh et al. .............................. 526/284 |
| 5,616,224 | 4/1997 | Boling .............................. 204/298.08 |
| 5,714,009 | 2/1998 | Boling ........................... 118/723 MW |
| 5,719,705 | 2/1998 | Machol ................................. 359/581 |
| 5,798,027 | 8/1998 | Lefebvre et al. ................ 204/192.26 |

FOREIGN PATENT DOCUMENTS

| | | |
|---|---|---|
| 128714 | 7/1977 | (DE) . |
| 2180262 | 3/1987 | (GB) . |
| 62-284076 | 6/1986 | (JP) . |
| 02 127 464 * | 6/1987 | (JP) ................ 204/298.09 |
| WO97/35224 | 9/1997 | (WO) . |

* cited by examiner

*Primary Examiner*—Nam Nguyen
*Assistant Examiner*—Gregg Cantelino
(74) *Attorney, Agent, or Firm*—Burns, Doane, Swecker & Mathis, L.L.P.

(57) ABSTRACT

A method and apparatus for vacuum coating plastic lens elements employs Meissner traps and a drum work holder configuration for effectively condensing water vapor in the system.

30 Claims, 5 Drawing Sheets

METHOD AND APPARATUS FOR VACUUM COATING PLASTIC PARTS

FIELD OF THE INVENTION

The present invention relates to methods and apparatus for vacuum coating plastic parts, and especially, for reactive sputter coating of plastic ophthalmic lens elements. As used herein, lens elements include, according to context, edged lenses, semi-finished lenses and lens blanks. Also included are wafers for forming laminate lenses or wafer blanks therefor. Ophthalmic uses of the lens elements include uses in eyeglasses, goggles and sunglasses.

BACKGROUND AND OBJECTS OF THE INVENTION

Ophthalmic lens elements are frequently coated to achieve special properties. Anti-reflection coatings improve the transmittance of visible light and the cosmetic appearance of the lenses. Reflective coatings may be employed in sun lenses to reduce light transmittance to the eye, to protect the eye from UV radiation and/or to impart cosmetic colorations to the lens. Coatings may also provide other beneficial properties such as increased hardness and scratch resistance and anti-static properties.

Desirable lens coatings may be created by applying single or multiple layers of metal or semi-metal oxides to surfaces of the lens element. Such materials include oxides of silicon, zirconium, titanium, neobium and tantalum. Examples of such multilayer coatings are given, for example, in U.S. Pat. No. 5,719,705 to Machol entitled "Anti-static Anti-reflection Coatings", assigned to applicant. Interference filter coatings for sunglasses are disclosed, for example, in U.S. Pat. No. 2,758,510 to Auwarter.

Various methods are disclosed in the prior art for applying metal and semi-metal oxide coatings to ophthalmic lenses. Ritter et al. U.S. Pat. No. 4,172,156 discloses vacuum evaporation in an oxygen atmosphere of Cr and Si to form coating layers on a plastic lens. Reactive sputter deposition of various oxide layers on lens elements is disclosed in the above-mentioned '705 patent to Machol.

Reactive sputtering in general is a conventional technique often used, for example, in providing thin oxide coatings for such items as semi-conductor wafers or glass lamp reflectors. Examples of various conventional vacuum deposition systems for the formation of coatings by reactive sputtering are disclosed in the following patents: U.S. Pat. Nos. 5,616,224 to Boling; U.S. Pat. No. 4,851,095 to Scobey et al.; U.S. Pat. No. 4,591,418 to Snyder; U.S. Pat. No. 4,420,385 to Hartsough; British Patent Application GB 2,180,262 to Wort et al.; Japanese Kokai No. 62-284076 to Ito; and German Patent No. 123,714 to Heisig et al.

Most ophthalmic lenses produced today are made from a single plastic body or laminated plastic wafers. The plastic material may include thermoplastic material such as polycarbonate or thermoset material such as diallyl glycol carbonate types, e.g. CR-39 (PPG Industries). The material may also be a cross linkable polymeric casting composition such as described in U.S. Pat. No. 5,502,139 to Toh et al and assigned to applicant. The challenge is to adapt conventional vacuum deposition systems to high volume production of plastic lens elements, while ensuing a high degree of control over the thickness and composition of the coating.

Accordingly, it is an object of the present invention to improve the degree of control over the thickness and composition of thin metal and semi-metal oxide coatings deposited on plastic lenses.

Figure 1:
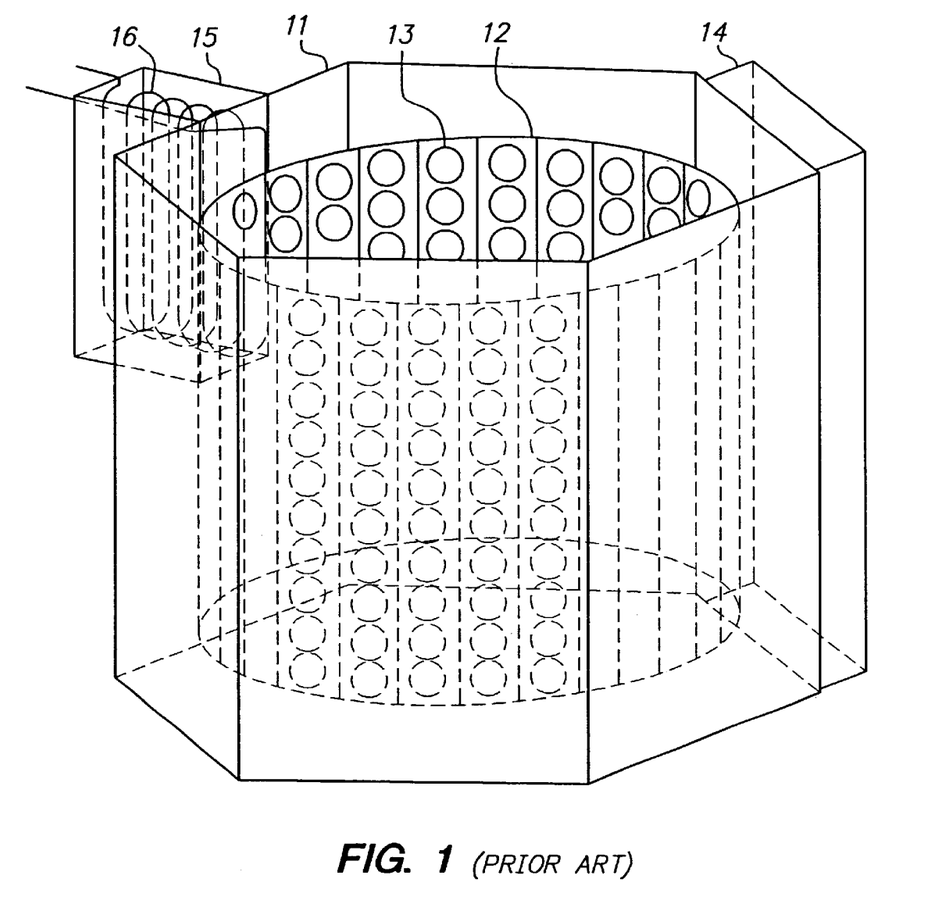
FIG. 1 is a pictorial view in partial phantom of a system known in the prior art for vacuum coating plural plastic lens elements.

Anti-reflection coating of plastic ophthalmic lenses by physical vapor deposition has traditionally been performed by means of thermal evaporation, or more recently, e-beam evaporation of metal and semi-metal oxides in a vacuum of typically significantly better than 10E-5 Torr. Anti-reflection coating of plastic lenses in spinning drum coaters by means of sputter technology is a relatively recent development. A conventional vacuum system used for this purpose is shown in FIG. 1. The system includes a vacuum coating chamber 11, which contains a hollow workpiece holder or drum 12. Lens elements, such as lens 13 are arranged in columns on an external surface of the drum 12. A coating applicator 14 is located in a wall of the vacuum chamber adjacent the drum 12. In a preferred embodiment, the coating applicator may be a combination of magnetron sputtering targets, microwave plasma generator, reactive gas supply, and reversing power supply such as disclosed in U.S. Pat. No. 5,616,224 to Boling, which is hereby incorporated by reference.

A pumping plenum 15 is attached to vacuum pumps (not shown) which evacuate the vacuum chamber 12. A cryopumping surface is provided in the form of cryocoils 16 in the plenum 15. The cryopumping surface is also known as a "Meissner trap". Conventionally the Meissner trap takes the form of a coiled or serpentine metal tube through which a coolant passes. Advantageously, the coolant is maintained at a temperature well below the freezing point of water. The Meissner trap is used to remove water vapor from the system.

In most such drum coaters the placement of the cryocoils in the pumping chamber plenum is favored. The prime reason for this particular placement is that it is done with a view to protecting the subsequent pumps, especially large roughing pumps, from excessive water contamination which can reduce the life and efficacy of such pumps. A secondary reason for such placement appears to be the desire to keep the cryocoils away from the rotating drum to avoid somewhat greater mechanical complexity, the danger of the parts held on the drum colliding with the cryocoils and to provide greater ease of maintenance of both the coils and the drum. However, Meissner traps have been located in the vacuum chamber rather than the plenum in systems for vacuum coating work pieces on holders other than plastic lenses on drums as disclosed in U.S. Pat. No. 4,647,361 to Bauer and U.S. Pat. No. 5,121,707 to Kanoo.

Plastic lenses are usually thoroughly baked at temperatures in excess of 90° C. for one to several hours prior to introduction to the vacuum system to reduce water vapor outgassing. Load sizes of plastic lenses have been limited to about 200. Pump-down times to base vacuums in the 10E-6 Torr regime are typically in the order of 30 minutes or more.

It is another object of the present invention to reduce the processing time required to deposit vacuum coatings on plastic parts.

It is another object of the present invention to provide an apparatus for depositing a high quality vacuum coating on large numbers of plastic lens elements in a system which is relatively inexpensive to construct and operate.

These and other objects and features of the present invention will be apparent from the written description and drawings presented herein.

SUMMARY OF THE INVENTION

One apparently unrecognized problem with the vacuum coating of plastics is the ongoing effect of large amounts of water vapor (or other gas or solvent) outgassing from the plastic in the presence of plasmas, even after a base pressure is reached which would be considered satisfactory for beginning to process low outgassing materials (e.g. glass). For instance, a particular problem has been found in the deposition of multi-layer anti-reflection (AR) coatings of metal and semi-metal oxides on plastic ophthalmic lenses by means of sputter deposition in a drum coater. The problem is that conventionally designed coaters do not provide sufficient process control in the presence of the outgassing from plastics whereas the same coater design is found to be perfectly acceptable for coating glass components. The problem arises from the breakdown of water molecules into their constituent atoms in the presence of sputter plasmas. The problem may well be exacerbated by the presence of specialized plasmas such as those in processes such as described in U.S. Pat. No. 5,616,224 to Boling, in which a microwave excited plasma is used to increase the rate of oxidation of freshly deposited metal surfaces and to overcome some problems which arise with sputter magnetrons utilizing polarity reversing power supplies.

Applicant has determined that the conventional placement of the cryocoil in the plenum ignores, to a large extent, the different requirement that drum coaters and plastic workpieces place on such systems compared with conventional evaporative box coaters. In the latter the vast majority of molecules in the vacuum chamber have unobstructed access to (i.e. can "see") the cryocoil in the plenum. In a drum coater this is not true. Applicant has observed that, in the reactive sputtering drum coater design previously used by applicant to provide coated lenses in the prior art, the vast majority of molecules in the chambers were obstructed from direct access to the plenum—they could not "see" the cryocoil because the drum wall runs close (within a few inches) of the mouth of the plenum.

As noted above, the original use of the drum coating system was in a process to deposit multi-layer coatings on glass objects, especially lamps and reflectors. The amount of water vapor outgassed by glass components in a vacuum, especially if they have been preheated or outgassed in a heated oven, is believed to be considerably less than that outgassed by a large load of plastic lens elements (typically about 400 lenses, each 3" diameter). These lens elements absorb water throughout the material of which they are composed in contrast to the situation with glass components where water is merely adsorbed on the surface. Some plastic lenses absorb up to several percent by weight of water.

Conventional wisdom has it that once a vacuum system has been pumped down to a satisfactory base pressure for a particular process then that is sufficient. However, applicant has determined that process instability results from the very substantially greater water out-gassing from plastics (as compared to glass components). Even after reaching a base pressure which had been shown to be perfectly satisfactory for glass coating, continued out-gassing and instability are believed to be present. The increased stability and improved pump down speed provided by the present invention were surprising.

A preferred embodiment of the present invention is a method and system for sputter coating plastic ophthalmic lens elements. The system includes a vacuum chamber containing a hollow, apertured drum with a substantially hollow interior. Large numbers of plastic ophthalmic lens elements (for example 200 to 400) are located in a two dimensional array on a radially outwardly facing surface of the drum so that radially inwardly facing surfaces of the lens elements are exposed through apertures in the drum, to the hollow interior of the drum. Conduits for circulating coolant are located in at least one end wall of the vacuum chamber adjacent the hollow interior of the drum. A majority (i.e. at least 50%) of the water vapor outgassed by the plastic lens elements when placed under vacuum condenses on the conduits, whereby it is removed from active areas of the vacuum system. The system is configured so that at least one face of substantially all of the plural lens elements lies on an unobstructed line of sight with the at least one coolant conduit. The drum and at least one sputtering station are moved relatively to one another to apply various sputter coatings to the radially outward surfaces of the plastic lens elements.

Advantageously, in such a system the sputter coating is performed by a reactive DC or mid frequency magnetron sputter process in which sputter material reacts with a reactant gas to form an insulating layer on the radially outward surfaces of the lens elements and on portions of a sputter target. Oxides may be formed on electrode surfaces of the sputtering apparatus and may require arc suppression. The sputter coating may be performed using a microwave plasma generator and at least one applicator or sputter target located adjacent one another and radially outwardly from the drum.

In preferred embodiments of the present invention at least 200 lens elements are loaded onto the work holder before drawing a vacuum in the system and pump down is achieved in less than 10 minutes.

The present invention also includes apparatus for reactive sputtering of a thin oxide coating onto surfaces of plural plastic lens elements. The apparatus may include a vacuum chamber and a lens element holder located in the vacuum chamber and rotatable about an axis intersecting at least one wall of the vacuum chamber. The holder rotates the plural plastic lens elements past an elongated sputtering electrode. A source of oxygen is provided to facilitate formation of oxide layer(s) on the lens element. An elongated microwave plasma generator may be located adjacent to the sputtering electrode. The holder rotates the plural plastic lens element past the elongated plasma generator which produces a plasma to facilitate the reaction of the oxygen with material sputtered from the sputtering electrode to thereby provide an oxide coating on surfaces of the plural plastic lens elements.

At least one cooled surface is located in at least one wall of the vacuum chamber intersected by the axis of rotation of the holder. The cooled surface condenses substantially all the water vapor released into the vacuum chamber by exposed surfaces of the plural plastic lens elements. In a more preferred embodiment, the axis of rotation of the holder intersects two end walls of the vacuum chamber. Cryocoils may extend through at least about half of the portions of the two end walls facing the open ends of the rotating holder.

The lens holder may be a hollow drum rotated about its central axis, for example the drum may be generally cylindrical in shape. The plural lens elements may be arranged in columns on an outside surface of the drum. Advantageously, the drum is formed with apertures through which water vapor passes from an uncoated back surface of each lens element. The cryocoils on the end walls of the vacuum chamber may extend adjacent to edges of the external surface of the drum to facilitate condensing water vapor which would otherwise pass into the sputtering and reaction zones adjacent the external surface of the drum.

The cooled conduits employed in the present invention are arranged in a coil in each of the end walls of the vacuum chamber. The coils may be in serpentine form or in the form of loops, spirals or helices. The apparatus may also employ a second sputtering electrode located outside the holder and adjacent to at least one of the microwave plasma generator or first sputtering electrode. The second sputtering electrode may sputter a different metal or semi-metal than the first sputtering electrode to produce alternating coating layers of different oxides. The magnetron and sputtering electrode(s) may be located on a door through which lens elements are loaded onto the holders.

The foregoing has been provided as a convenient summary of aspects of the invention. The invention intended to be protected is, however, defined by the claims and equivalents thereof.

DETAILED DESCRIPTION

The disclosed embodiments address the need for effective cryopumping to handle large and continuing outgassing for plastic substrates, particularly in systems containing drum workpiece holders.

The conventional placement of the cryocoils, either in the pumping chamber plenum or on the inside vertical walls of the chamber is ineffective because the cold surface cannot be seen by the majority of molecules inside the chamber, i.e. inside the hollow spinning drum which holds the plastic parts as discussed above in connection with FIG. 1.

The effects of large water vapor outgassing loads throughout the process are especially deleterious when sputter deposition is employed. The plasma employed dissociates water vapor (and carbon dioxide) to create uncontrolled sources especially of oxygen but also of hydrogen. Both oxygen and hydrogen take part in the physical and/or chemical interactions of sputtering and oxidization in the growing metal or semi-metal oxide film. It should be noted that the uncontrolled source of hydrogen has deleterious effects on the process in that every hydrogen ion accelerated toward the sputter target contributes to the sputter ion current but not measurably to the sputter yield. It has also been conjectured that hydrogen may be incorporated in the growing film in a manner which may cause undesirable changes to its optical properties.

Figure 2:
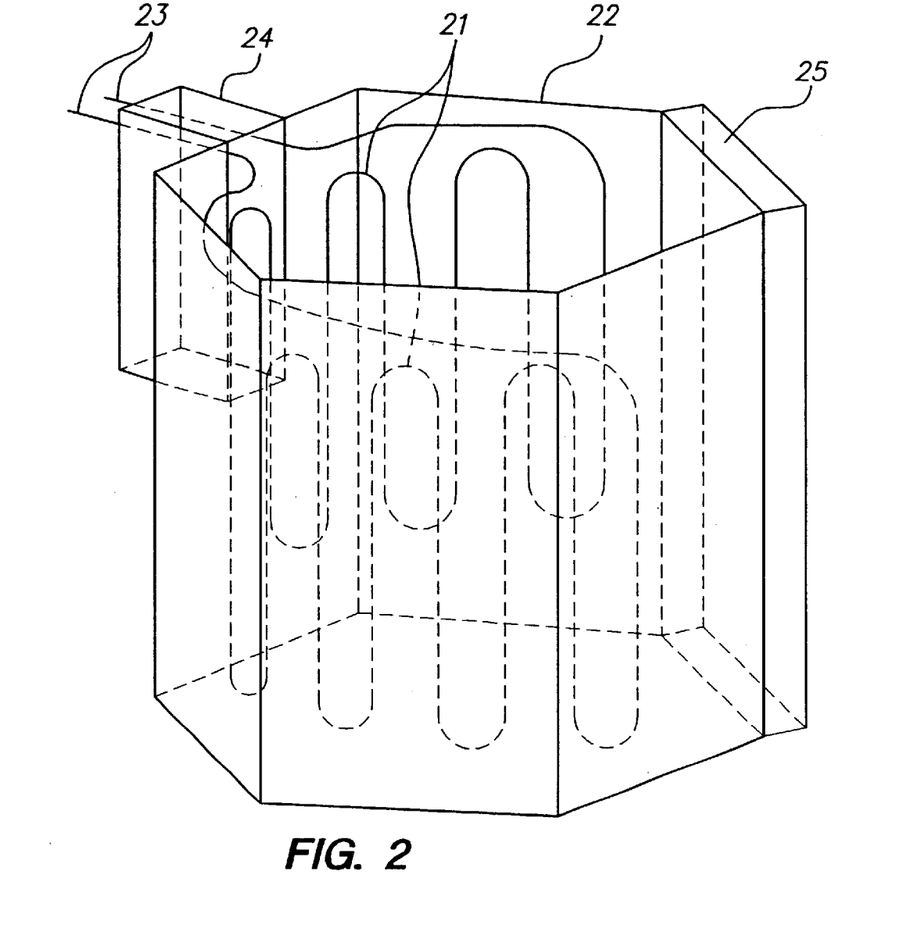
FIG. 2 is a pictorial view in partial phantom of drum vacuum coating system in which the cryocoils do not lie on a direct line of sight with surfaces of the workpieces.

FIG. 2 represents a cryocoil configuration suggested to applicant by a third party supplier. In the system serpentine cryocoils 21 are located in side walls of the vacuum chamber 22. Coolant for the coils enters and exits the coils through lines 23 which pass through the plenum 24.

When used with a drum workpiece holder, the drum blocks most line-of-sight paths between the coils and the plastic parts mounted on the drums. Furthermore, the cryocoils cannot obstruct the sputter applicator 25. It is difficult to locate a substantial amount of cooled surface in the vicinity of the sputter applicator 25.

Figure 3:
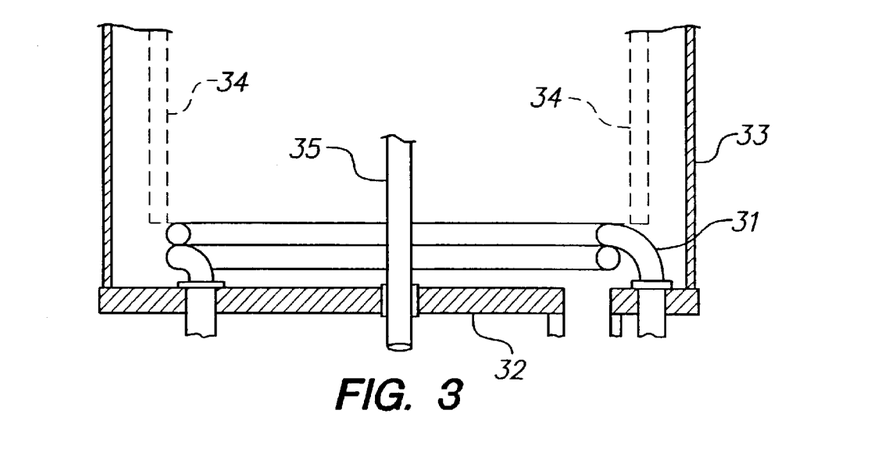
FIG. 3 is a cross-sectional view of a vacuum system in which the cryocoils do not lie on a direct line of sight with surfaces of the workpieces.

FIG. 3 represents a cryocoil configuration similar to that shown in U.S. Pat. No. 4,647,361 to Bauer, in which a coil of coolant conduit 31 is located adjacent to a bottom wall 32 of a vacuum chamber 33. If a workpiece holder drum 34 were used in such a system (not shown in Bauer) and mounted for rotation on shaft 35, it will be seen that the line-of-sight access from plastic parts mounted on the drum would be oblique and quite limited.

In preferred embodiments of the present invention cryocoils of appropriate size are placed in a drum coater in locations whereby the majority of vapor molecules have direct and unobstructed access to the cryocoil. Such locations and coils at the top and bottom of the hollow rotating drum are illustrated in FIG. 4.

Figure 4:
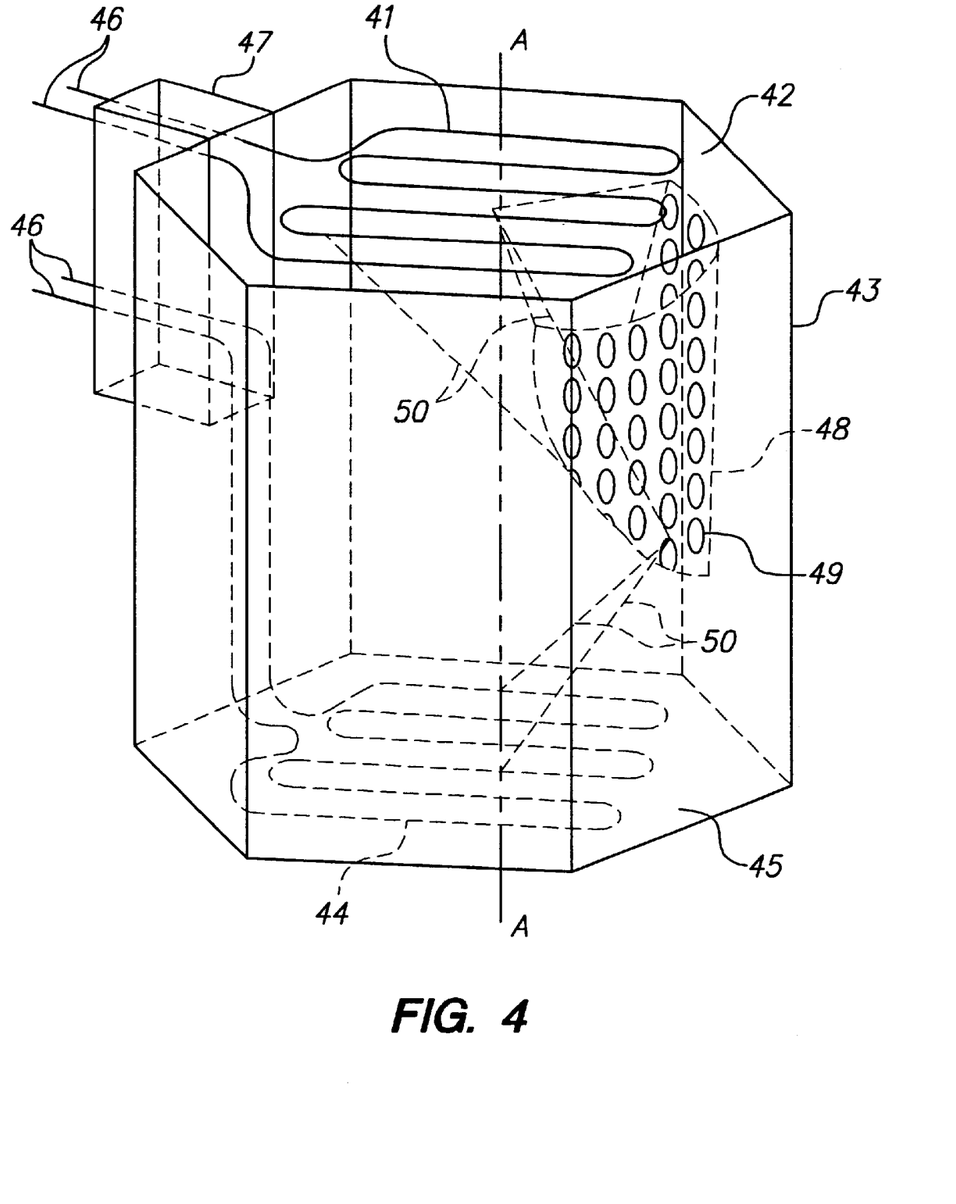
FIG. 4 is a pictorial view in partial phantom of a system for vacuum coating plastic lens elements employing cryocoils in the upper and lower walls of the vacuum chamber in accordance with the present invention.

In FIG. 4, a first serpentine cryocoil 41 is located in an upper wall 42 of a drum coater vacuum chamber 43 and covers a substantial area of the upper wall including a central portion thereof. Similarly, a second serpentine cryocoil 44 is located in a lower wall 45 of the vacuum chamber and covers a substantial area of the lower wall including a central portion.

A flow of refrigerant is provided to the cryocoil through inlets 46 passing through the plenum 47 of the vacuum chamber. The refrigerant may be hydrofluorocarbon, liquid nitrogen, liquid air or other coolant having sufficient capacity to cool the surface of the conduits to facilitate vapor condensation.

A hollow, cylindrical workpiece holder or drum, such as shown in FIG. 1, is located in the vacuum chamber. A portion of the drum is indicated at 48. The drum is mounted for rotation about an axis A—A which passes generally perpendicularly through the upper and lower walls 42 and 45 of the vacuum chamber.

Plural plastic lens elements such as elements 49 (for example 400 such lens elements) are mounted on the drum. Radially outwardly facing optical surfaces of the lens element may be coated by repeatedly rotating the elements past various sputtering applicators. The lens elements are mounted such that radially inwardly facing surface of the lens elements is exposed to the hollow interior of the drum through apertures in the drum wall. A direct line of sight path exists between these exposed surfaces and substantial portions of the cryocoils 41 and 44. Several such lines of sight for lens elements 49 are indicated by the dotted lines 50.

Approximately the same total length of cryocoil (as compared to that in the plenum in FIG. 1) is placed in the system illustrated in FIG. 4. The effect on pumpdown time and, more particularly for process stability, for reactive AR sputter coating of plastic lenses is dramatic. Furthermore, the stabilization of the process, due to continued removal of water vapor and thus of the uncontrolled evolution of oxygen, allows clear, fully oxidized films to be produced with a full load of lenses. This had not been achieved with the cryocoil placement of the prior art. Plastic lenses of higher refractive index materials often have significantly more water uptake than CR39 and thus the advantages of the invention are even more significant in that case.

Vacuum Flow Regimes, Placement of Cryocoils

The following is from Leybold's Vacuum Notes:

Vacuum Flow Regimes

Mean Free Path (L) is given by
$L \times P = 5.07E-3$ (Torr cm)
$] = 50.7$ (m Torr mm) (for air at 20° C.)
where p = pressure.

Viscous Flow $$Pd > 4600 \text{ mTorr mm } L < d/100$$

where d=the shortest distance across a conducting member.

Intermediate (Transitional, Knudsen) Flow $$100 < P_d < 4600 \text{ mTorr mm } d/100 < L < d/2$$

Molecular Flow $$Pd < 100 \text{ mTorr mm } L > d/2$$

Sputter Drum Coater Flow Regimes

Argon and air have very similar mean free paths (=to within 5% at 1 Torr). The Mean Free Path L for water vapor is almost exactly ⅔ that of air at 1 Torr).

Table I sets out the various flow regimes during deposition for a typical sputter drum coater at various working pressures in the mTorr regime and for two characteristic distances is the radial spacing from drum to chamber wall and from drum to sputtering target.

30 mm (1¼) (or somewhere near that figure) will make no difference to the conclusions regarding operating flow regime.

Placement of Cryocoils

Advantageously, the cryocoils are placed so that they are at the top and bottom of the drum. They should also be placed as near as possible to the portion of the chamber where the sputter applicators and plasmas are located.

As shown above, the process is usually operating in the transitional flow regime and closer to the molecular flow regime than the viscous flow regime. The gas conductance on both sides of the drum, from a vertical midpoint on the drum, to the top and bottom of the drum, is demonstrably greater on average than that to the first available position for cryocoil tubes on the inside walls of the chamber beyond the edges of the coating applicator. Conventionally, the coating applicators are located in the vacuum chamber door. Placing cryocoils in the door is fraught with mechanical difficulties of placement, design and manufacture. Their total effective area (near the operational plasma zones) will be very limited.

In contrast, standard ⅝" OD cryocoils of some 30 feet in length (or more) at the top and bottom of the drum are feasible and relatively straightforward to install with copper tubing in positions which are at less risk to mechanical damage. In a 45 inch diameter vacuum system, four coils of ⅝" tubing starting at 36" diameter and spaced 2.125" center to center [1.5" from OD to OD] will provide about 30 ft of tubing at the top of the drum—a similar arrangement may be placed at the bottom of the drum.

In the first few seconds of sputtering silica on the lenses there is very good reason to believe that the outgassing from the coated (outwardly facing) lens surfaces will decrease markedly, probably to negligible proportions, due to the

TABLE I

Flow Regimes

| Pressure (P) (mTorr) | MFP (L) (mm) | Characteristic Distance (d) (mm) | Where is d measured | Pd (mTorr mm) | Pd Regime | d/100 (mm) | L (mm) | d/2 (mm) | L Regime |
|---|---|---|---|---|---|---|---|---|---|
| 3 | 17 | 25 | drum to chamber wall | 75 | Molecular Flow | 0.25 | 17 | 12.5 | Molecular Flow |
| 4 | 10 | 25 | drum to chamber wall | 125 | Transitional Flow | 0.25 | 10 | 12.5 | Transitional Flow |
| 8 | 6 | 25 | drum to chamber wall | 200 | Transitional Flow | 0.25 | 6 | 12.5 | Transitional Flow |
| 12 | 4 | 25 | drum to chamber wall | 300 | Transitional Flow | 0.25 | 4 | 12.5 | Transitional Flow |
| 3 | 17 | 67 | drum to target | 201 | Transitional Flow | 0.67 | 17 | 33.5 | Transitional Flow |
| 5 | 10 | 67 | drum to target | 335 | Transitional Flow | 0.67 | 10 | 33.5 | Transitional Flow |
| 8 | 6 | 67 | drum to target | 536 | Transitional Flow | 0.67 | 6 | 33.5 | Transitional Flow |
| 12 | 4 | 67 | drum to target | 804 | Transitional Flow | 0.67 | 4 | 33.5 | Transitional Flow |
| Viscous Flow | | | Pd | >4600 mTorr mm | | d/100< | L | | <d/100 |
| Transitional Flow | 4600> | | Pd | >100 mTorr mm | | | L | | <d/2 |
| Molecular Flow | | | Pd | <100 mTorr mm | | | L | | >d/2 |

Note that the process does not operate very close to the Viscous Flow regime and in fact is usually bordering on the Molecular Flow regime or occasionally in it. Whether the drum to chamber wall distance is the typical 25 mm (1") or excellent moisture barrier properties of silica. This being the case, the remaining major source of outgassing during most of the deposition cycle will be the rear surfaces of the plastic lenses.

Cryocoils placed top and bottom of the drum will deal with this outgassing very effectively and can act as a trap to stop water vapor diffusing from the inside of the drum over the top and bottom of the drum to the outside where it is difficult to provide an effective Meissner trap in the operational region near the plasmas.

Figure 5A:
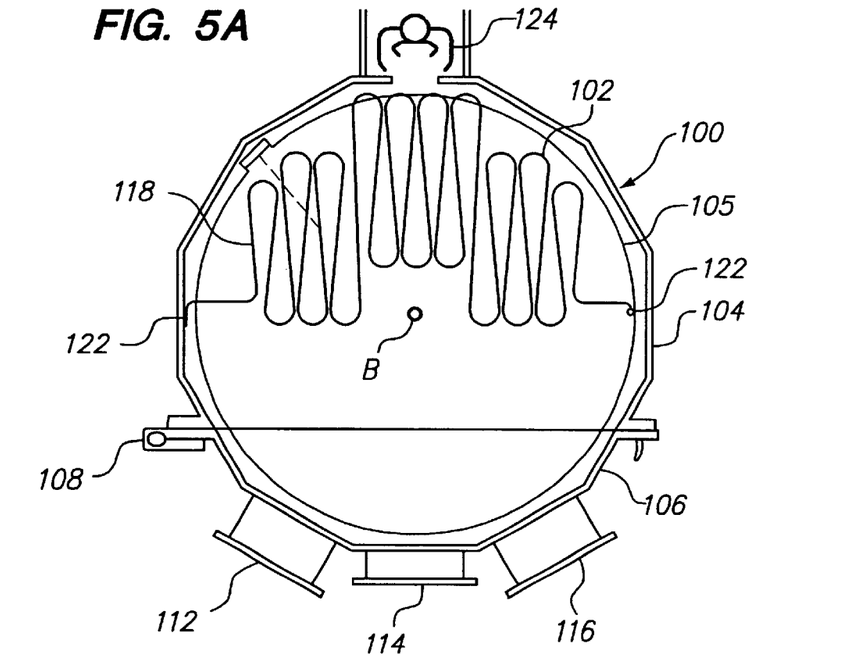
FIGS. 5(a) and (b) are top and bottom views of a vacuum system in accordance with the present invention for coating plural plastic lens elements.
Figure 5B:
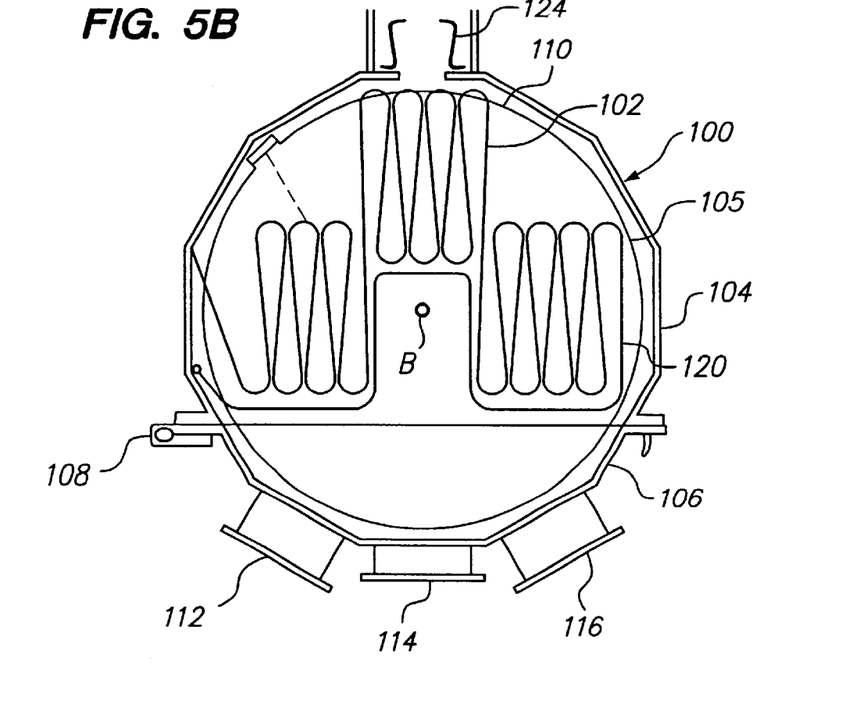
Figure 6:
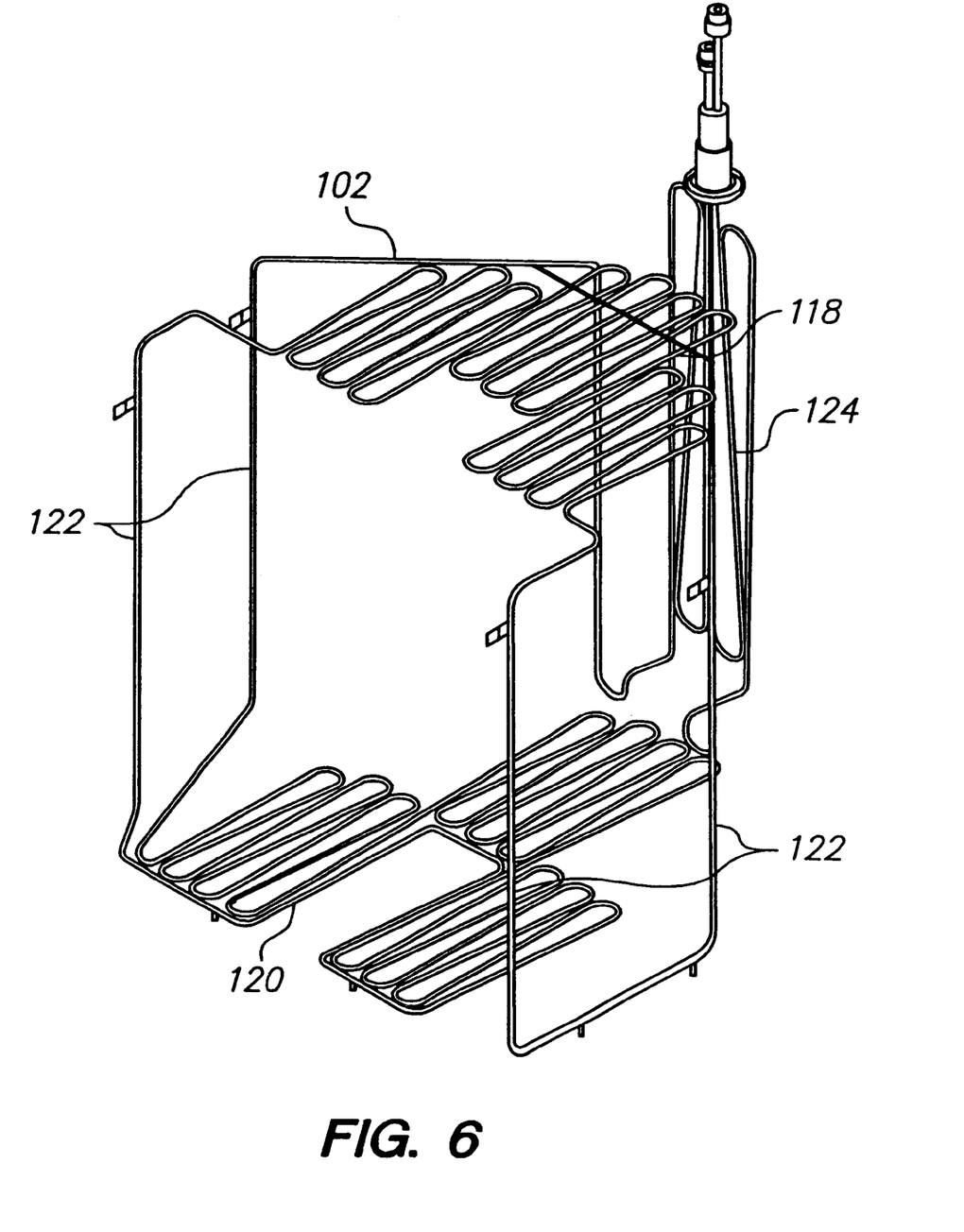
FIG. 6 is a pictorial view of the cryocoils employed in the system of FIG. 5.

Another preferred embodiment of the present invention is illustrated in FIGS. 5 and 6. FIGS. 5(a) and (b) are, respectively, top and bottom views of a vacuum system 100 for coating plastic lens elements. The system employs an arrangement of cryocoils 102, which are shown in isolation in perspective view in FIG. 6.

The vacuum chamber has an outer wall 104 in the shape of a twelve-sided prism. A cylindrical drum 105 is located inside the vacuum chamber. A chamber door 106 is hinged at 108 and provides access to the outer cylindrical surface of the drum 105 for loading lens elements onto the drum. The drum 105 is mounted for rotation about an axis passing through points B. Lens elements (not shown) may be mounted in registration with apertures on the drum so that one side is exposed to system coating applicators and the other side is exposed to direct lines of sight with the cryocoils in the top and bottom walls of the system.

The vacuum coating applicators may be located in the door 106. In a preferred embodiment the coating applicators may include a first sputter magnetron 112, a microwave plasma generator 114 and a second sputter magnetron 116. Alternatively the positions of the first sputter magnetron 112 and the microwave plasma generator 114 may be reversed. Advantageously, the first and second sputter magnetrons may include targets of different metal and/or semi-metal materials to form sequential coatings of diverse oxides on the lens elements, the coatings having different indices of refractions. Layers are built up by repeatedly rotating the lens elements on the drum past the vacuum coating applicators. For example, the system may be used to apply a multi-layer oxide coating to a lens element whose radially outwardly facing optical surface has been treated with a hard coat. A five layer coating may comprise alternating layers of silicon oxide and zirconium oxide, silicon oxide layers being outermost and innermost.

The outer cylindrical face of the drum 105 is typically 1 to 2 inches from the inner wall of the vacuum chamber and typically 2 to 3 inches from the target surface of the coating applicators. The drum itself may be on the order of 40 inches in diameter and 40 inches high and carry hundreds of lens elements on its outer surface. Initially the lens elements may present on the order of 5600 square inches of exposed surface, approximately half of which (one side of each lens element) is coated during a coating run. Using the system depicted in FIGS. 5 and 6 pump down has been achieved in less than 10 minutes with a full load of 400 baked-out, uncoated 3" lenses. This represents an approximately three fold reduction in pump down time in comparison to a system with cryocoils located in the plenum. Smaller loads would present smaller uncoated surface area or the order of 1000 square inches (about 1400 square inches for a load of 200 3" lenses).

FIG. 6 is a perspective view of the cryocoils used in the system of FIG. 5. The cryocoils on the upper wall and the cryocoils on the lower wall are indicated at 118 and 120, respectively. Conduits running along the side walls are indicated at 122. Cryocoils in the plenum are indicated at 124.

The instant invention has been described with respect to particular preferred embodiments. The invention to be protected, however, is intended to be defined by the literal language of the claims and equivalents thereof.

I claim:

1. An apparatus for sputter coating plastic parts in a vacuum chamber, comprising:
   a rotating drum for carrying said plastic parts and for rotating the plastic parts past at least one vacuum coating applicator, said drum having a hollow central portion and at least one substantially open end, the drum having a plurality of apertures extending through a wall thereof corresponding to locations for accommodating the plastic parts; and
   first cryocoils located in the vacuum chamber extending through a first area facing a substantial portion of the at least one substantially open end of the rotating drum, wherein said apertures have unobstructed lines of sight to the first cryocoils and wherein said first cryocoils are configured to capture water vapor outgassed by the plastic parts during sputter coating.

2. The apparatus of claim 1, further comprising second cryocoils located in the vacuum chamber, the first and second cryocoils being located at two opposite end walls of the vacuum chamber, respectively, wherein the rotating drum has two substantially open ends, and wherein the first and second cryocoils extend through the first area and a second area, respectively, the first and second areas facing at least about half of the areas of the substantially open ends of the rotating drum, respectively, wherein said apertures have unobstructed lines of sight to the first and second cryocoils and wherein the first and second cryocoils are configured to capture water vapor outgassed by the plastic parts during sputter coating.

3. The apparatus of claim 1, wherein a majority of all water vapor outgassed by the plastic parts at pressures below one millitorr is condensed on the first cryocoils.

4. The apparatus of claim 1, wherein the first cryocoils are disposed in a first plane oriented substantially perpendicular to an axis of rotation of the rotating drum.

5. The apparatus of claim 2, wherein the first and second cryocoils are disposed in first and second planes, respectively, the first and second planes being oriented substantially perpendicular to an axis of rotation drum.

6. A method for sputter coating plastic ophthalmic lens elements, comprising:
   providing a vacuum chamber containing at least one sputtering station and a drum with at least one open end and a substantially hollow interior, an outer wall of the drum being formed with apertures approximately the same size as the lens elements;
   locating plural plastic ophthalmic lens elements on a radially outward facing surface of the outer wall of the drum so that radially inwardly facing surfaces of the lens elements are exposed, through the apertures in the drum, to the substantially hollow interior of the drum;
   circulating coolant in conduits located in at least one end of the vacuum chamber adjacent the substantially hollow interior of the drum, the radially inwardly facing surfaces of the plastic ophthalmic lens elements having unobstructed lines of sight to the conduits;
   causing relative motion between the drum and at least one sputtering station; and
   sputter coating the radially outward facing surfaces of the plastic ophthalmic lens elements, wherein water vapor outgassed by the plastic ophthalmic lens elements during sputter coating is captured by the conduits.

7. The method of claim 6, wherein the sputter coating is performed by a reactive DC process in which sputtered material reacts with a reactant gas to form an insulating layer on the radially outward facing surfaces of the plastic ophthalmic lens elements.

8. The method of claim 6, wherein the conduits are disposed in at least one plane oriented substantially perpendicular to an axis of rotation of the drum.

9. The method of claim 8, wherein the conduits are disposed in first and second planes oriented substantially perpendicular to the axis of rotation of the drum.

10. The method of claim 6, wherein the sputter coating is performed by a reactive DC process in which sputtered material reacts with a reactant gas to form an optical coating on the radially outward facing surfaces of the plastic ophthalmic lens elements.

11. A method for sputter coating plural plastic lens elements, comprising:

locating plural plastic lens elements on a work holder in a vacuum chamber;

rotating the work holder relative to a sputtering applicator;

providing a Meissner trap in the vacuum chamber such that uncoated faces of substantially all of the plural plastic lens elements have unobstructed lines of sight with a substantial portion of the Meissner trap at any point in a rotation of the work holder; and sputter coating the plural plastic lens elements with the sputtering applicator, wherein water vapor outgassed by the plural plastic lens elements during sputter coating is captured by the Meissner trap.

12. The method of claim 11, wherein the plural plastic lens elements have uncoated and exposed surfaces, a total surface area of which being greater than 1000 square inches which is exposed during the sputter coating of opposite surfaces of the lens elements.

13. The method of claim 12, wherein a majority of all water vapor released by said uncoated and exposed surfaces of the plural plastic lens elements is condensed by the Meissner trap at pressures below one millitorr.

14. The method of claim 11, wherein the sputter coating is a reactive sputter coating of at least one metal or semi-metal oxide.

15. The method of claim 11, wherein at least 200 plastic lens elements are loaded onto the work holder before drawing a vacuum in the vacuum chamber and wherein pump down to operating pressure is achieved in less than 10 minutes.

16. The method of claim 12, wherein the total surface area of the uncoated and exposed surfaces of the plural plastic lens elements is greater than 2500 square inches.

17. An apparatus for reactive sputtering of a thin oxide coating onto surfaces of plural plastic lens elements, comprising:

a vacuum chamber;

a lens element holder located in the vacuum chamber and rotatable about an axis intersecting at least one wall of the vacuum chamber, the lens element holder having a wall with a plurality of apertures extending therethrough provided at locations for holding the plural plastic lens elements;

an elongated sputtering electrode past which the lens lement holder rotates the plural plastic lens elements;

a source of oxygen;

an elongated microwave plasma generator adjacent to the sputtering electrode and past which the lens element holder rotates the plural plastic lens elements for producing a plasma to facilitate the reaction of the oxygen with material sputtered from the sputtering electrode to thereby provide an oxide coating on surfaces of the plural plastic lens elements; and a cooled surface area associated with the wall of the vacuum chamber intersected by the axis of rotation of the lens element holder, the cooled surface area being provided for condensing a majority of all the water vapor released into the vacuum chamber by exposed surfaces of the plural plastic lens elements during sputtering, the cooled surface area and the lens element holder being configured such that the apertures in the wall of the lens element holder have unobstructed lines of sight to a substantial portion of the cooled surface area.

18. The apparatus of claim 17, wherein the axis of rotation of the lens element holder intersects two end walls of the vacuum chamber, and wherein the cooled surface area comprises cooled surfaces disposed adjacent to the two end walls.

19. The apparatus of claim 17, wherein the lens element holder is a hollow drum rotated about its central axis.

20. The apparatus of claim 19, wherein the hollow drum is generally cylindrical in shape and wherein the apertures are arranged in a two-dimensional array in the wall of the drum.

21. The apparatus of claim 20, wherein water vapor passes from an uncoated back surface of each lens element, into the hollow of the cylindrical drum and to the cooled surfaces where it condenses.

22. The apparatus of claim 17, wherein the cooled surface area comprises walls of at least one conduit containing a circulating coolant.

23. The apparatus of claim 22, wherein the coolant is selected from the group of a hydrofluorocarbon, liquid nitrogen and liquid air.

24. The apparatus of claim 22, wherein the lens element holder is a substantially hollow drum with a continuous external surface which is rotatable past the sputtering electrode and microwave plasma generator, and wherein conduits containing the circulating coolant cover the end walls of the vacuum chamber and extend adjacent to edges of an external surface of the drum to facilitate condensing water vapor which would otherwise pass to sputtering and reaction zones adjacent the external surface of the drum.

25. The apparatus of claim 24, wherein the conduits are arranged in a coil adjacent to each of the end walls of the vacuum chamber.

26. The apparatus of claim 25, wherein the conduits are arranged in a serpentine form adjacent to each of the end walls of the vacuum chamber.

27. The apparatus of claim 17, wherein a metal or semi-metal is sputtered by the sputtering electrode.

28. The apparatus of claim 17, further comprising a second sputtering electrode located outside the lens element holder and adjacent to at least one of the microwave plasma generator or the first sputtering electrode.

29. The apparatus of claim 28, wherein the second sputtering electrode sputters a different metal or semi-metal than the first sputtering electrode.

30. The apparatus of claim 17, wherein the microwave plasma generator and sputtering electrode are located on a door through which lens elements are loaded onto the holder.

* * * * *